(12) United States Patent
Hausperger et al.

(10) Patent No.: US 7,923,986 B2
(45) Date of Patent: Apr. 12, 2011

(54) DEVICE AND METHOD FOR MEASURING A CURRENT FLOWING IN AN ELECTRICAL CONDUCTOR

(75) Inventors: Christian Hausperger, Bonbruck (DE); Edgar Kindler, Landshut (DE); Bernhard Rollgen, Munich (DE)

(73) Assignees: Lisa Draexlmaier GmbH, Vilsbiburg (DE); EPCOS AG, Münech (DE)

( * ) Notice: Subject to any disclaimer, the term of this patent is extended or adjusted under 35 U.S.C. 154(b) by 0 days.

(21) Appl. No.: 11/879,013

(22) Filed: Jul. 13, 2007

(65) Prior Publication Data
US 2008/0048655 A1 Feb. 28, 2008

(30) Foreign Application Priority Data

Jul. 14, 2006 (DE) .................. 10 2006 032 763

(51) Int. Cl.
G01R 15/20 (2006.01)

(52) U.S. Cl. ................. 324/117 H; 324/117 R; 324/127

(58) Field of Classification Search .............. 324/117 H, 324/117 R, 126–127
See application file for complete search history.

(56) References Cited

U.S. PATENT DOCUMENTS

| | | | |
|---|---|---|---|
| 3,482,163 A | 12/1969 | Peek et al. | |
| 3,974,425 A | 8/1976 | Ueda et al. | |
| 4,059,798 A | 11/1977 | Dierker et al. | |
| 4,491,790 A * | 1/1985 | Miller | 324/142 |
| 4,939,448 A | 7/1990 | Gudel | |
| 4,947,108 A | 8/1990 | Gudel | |
| 5,180,970 A | 1/1993 | Ross | |
| 5,446,435 A | 8/1995 | Etter | |
| 5,457,873 A | 10/1995 | Cattaneo | |
| 5,475,301 A | 12/1995 | Kawakami et al. | |
| 6,005,383 A | 12/1999 | Savary | |
| 6,305,338 B1 * | 10/2001 | Kramer et al. | 123/179.3 |
| 6,411,078 B1 * | 6/2002 | Nakagawa et al. | 324/117 H |
| 6,548,998 B1 | 4/2003 | Gudel | |
| 6,788,046 B2 | 9/2004 | Lenhard et al. | |
| 7,332,903 B2 * | 2/2008 | Hausperger et al. | 324/117 H |
| 7,579,825 B2 * | 8/2009 | Hausperger et al. | 324/117 H |
| 2005/0127903 A1 * | 6/2005 | Sogge | 324/207.2 |
| 2005/0200353 A1 * | 9/2005 | Steinich et al. | 324/207.24 |
| 2006/0066292 A1 | 3/2006 | Tadatsu | |
| 2006/0158176 A1 | 7/2006 | Preusse et al. | |
| 2006/0290341 A1 | 12/2006 | Hausperger et al. | |
| 2007/0052407 A1 | 3/2007 | Hausperger et al. | |

FOREIGN PATENT DOCUMENTS

| | | |
|---|---|---|
| DE | 1209198 B | 11/1963 |
| DE | 25 06 918 C3 | 9/1975 |
| DE | 27 06 547 C3 | 9/1977 |
| DE | 38 35 101 A1 | 5/1989 |
| DE | 39 05 060 C2 | 8/1990 |
| DE | 42 29 065 A1 | 3/1994 |

(Continued)

*Primary Examiner* — Steven Loke
*Assistant Examiner* — Shaun Campbell
(74) *Attorney, Agent, or Firm* — Wolf, Greenfield & Sacks, P.C.

(57) ABSTRACT

A device for measuring a current flowing in an electrical conductor. The device comprises a magnetic circuit coupled to an electrical conductor. The magnetic circuit has an air gap and a magnetic field sensitive component disposed in the air gap to measure a magnetic field generated by the electrical conductor. A control core has a control winding configured to control an effective length of the air gap when the control winding is energized. A magnetic shield at least partially encloses the magnetic circuit, the magnetic field sensitive component and the control core.

11 Claims, 2 Drawing Sheets

FOREIGN PATENT DOCUMENTS

| | | | |
|---|---|---|---|
| DE | 42 29 948 A1 | 3/1994 |
| DE | 4229065 A1 | 3/1994 |
| DE | 199 10 411 C2 | 9/2000 |
| DE | 101 05 186 A1 | 8/2002 |
| DE | 10105186 A1 | 8/2002 |
| DE | 10331883 A1 | 2/2005 |
| DE | 69434496 T2 | 6/2006 |
| DE | 102005024075 A1 | 11/2006 |
| DE | 102005040316 A1 | 3/2007 |
| EP | 0 499 589 B1 | 1/1996 |
| EP | 0 558 702 B1 | 5/1996 |
| EP | 0886147 A1 | 7/1997 |
| EP | 0 584 295 B1 | 10/1997 |
| EP | 0 815 456 B1 | 1/1998 |
| EP | 1067391 A1 | 1/2001 |
| EP | 1154277 A1 | 11/2001 |
| EP | 1 250 605 B1 | 3/2004 |
| EP | 1 084 417 B1 | 4/2004 |
| EP | 1450176 A1 | 8/2004 |
| GB | 1071848 | 6/1967 |
| GB | 1 478 225 | 6/1977 |
| GB | 2 228 337 A | 2/1989 |
| JP | 01281715 A | 11/1989 |
| JP | 03170873 A | 7/1991 |
| WO | WO 00/54068 A1 | 9/2000 |
| WO | WO 01/40811 A2 | 6/2001 |
| WO | WO 2004/063738 A2 | 7/2004 |
| WO | WO 2004/074860 A1 | 9/2004 |
| WO | WO 2005/005998 A1 | 1/2005 |
| WO | WO 2005/106506 A1 | 11/2005 |

* cited by examiner

US 7,923,986 B2

DEVICE AND METHOD FOR MEASURING A CURRENT FLOWING IN AN ELECTRICAL CONDUCTOR

CROSS REFERENCE TO RELATED APPLICATION

Foreign priority benefits are claimed under 35 U.S.C. §119 (a)-(d) or 35 U.S.C. §365(b) of German Application No. 10 2006 032 763.2, filed Jul. 14, 2006, which is hereby incorporated by reference in its entirety.

BACKGROUND OF THE INVENTION

1. Field

The present invention relates to a sensor for measuring a current flowing in an electrical conductor 2. Discussion of Related Art The rising number of electrical consumer loads in motor vehicles has created an ever-increasing demand for power in on-board electrical systems of vehicles. As a result, the load on the on-board battery, which serves as a backup during operation of the vehicle and maintains the vehicle's voltage supply when the engine is switched off, is becoming ever greater. These greater loads can lead to a failure to completely charge the battery during engine operation, particularly where the vehicle is subject to increased use for short-run operations. Such incompletely charged batteries can result in dead batteries, vehicle break downs, and/or an inability to start a vehicle due to a low battery voltage.

Energy management systems are increasingly being used in vehicles to prevent battery charging failures. Such energy management systems are intended to ensure that the charging condition of the battery does not reach a critical state and to ensure a positive charging balance of the battery. These systems perform analysis of the battery's condition, based on measured variables for battery current, battery voltage and battery temperature. In many systems, the detection of a charging or discharging current is significant in keeping the battery at a non-critical charge level to ensure the ability to start a vehicle.

The sensor shown in FIGS. 3 and 4 is known from the prior art for use in a motor vehicle for monitoring flowing currents. As shown, a measuring shunt 202 is inserted in earth conductor 201 to detect the battery current. An analyzing unit 203 directly measures the voltage drop at the measuring shunt and from this measurement calculates the level of current that is flowing. The measuring shunt may be made of Manganin.

FIG. 3 shows the measuring set-up associated with a sensor like that shown in FIG. 4. A car battery 205 is connected to the vehicle earth by way of an earth conductor 201. The sensor, comprising measuring shunt 202 and analyzing unit 203, is integrated into earth conductor 201. Electrical consumer loads 206 of the vehicle are connected to the positive pole of battery 205 by way of a conductor 207.

The sensor and configuration of FIGS. 3 and 4 do exhibit some disadvantages. The measuring shunt has to be integrated into the conductor that carries the current, which causes additional design expenditure since it is necessary to ensure that shear and tensile forces are not imparted to the measuring shunt. Deformation of the measuring shunt may influence the measured result and, in some cases, can lead to a fault in the sensor. Moreover, the configuration of FIGS. 3 and 4 necessarily incurs a heat loss via the measuring shunt. By way of example, even when using low resistances, such as those associated with a 100 mW measuring shunt, heat is still lost and has to be dissipated.

To overcome disadvantages in prior art designs, there is a need for a sensor that can detect the charging and/or discharging current over a very wide range, for example from −200 A to 1500 A. There is also a need for a suitable sensor, such as for use in energy management of a vehicle, that can cover this wide range of currents and have a high dynamic response.

SUMMARY

According to one aspect, a device for measuring a current flowing in an electrical conductor is disclosed. The device comprises a magnetic circuit that coupled to an electrical conductor. The magnetic circuit has an air gap and a magnetic field sensitive component disposed in the air gap. The magnetic field sensitive component measures a magnetic field generated by the electrical conductor. The device also includes at least one control core that has a control winding configured to control an effective length of the air gap when the control winding is energized. The device includes a magnetic shield that at least partially encloses the magnetic circuit, the magnetic field sensitive component and the at least one control core.

According to another aspect, a method for measuring a current flowing in an electrical conductor is disclosed. The method comprises providing a device that comprises a magnetic circuit that coupled to an electrical conductor. The magnetic circuit has an air gap and a magnetic field sensitive component disposed in the air gap. The magnetic field sensitive component measures a magnetic field generated by the electrical conductor. The device also includes at least one control core that has a control winding configured to control an effective length of the air gap when the control winding is energized. The device includes a magnetic shield that at least partially encloses the magnetic circuit, the magnetic field sensitive component and the at least one control core. The method also comprises measuring current flowing through the electrical conductor without exciting the control winding of the at least one control core and measuring current flowing through the electrical conductor while exciting the control winding to saturate the at least one control core.

Various embodiments of the present invention provide certain advantages. Not all embodiments of the invention share the same advantages and those that do may not share them under all circumstances.

Further features and advantages of the present invention, as well as the structure of various embodiments of the present invention are described in detail below with reference to the accompanying drawings.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. Various embodiments of the invention will now be described, by way of example, with reference to the accompanying drawings, in which.

DETAILED DESCRIPTION OF THE DRAWINGS

Figure 1:
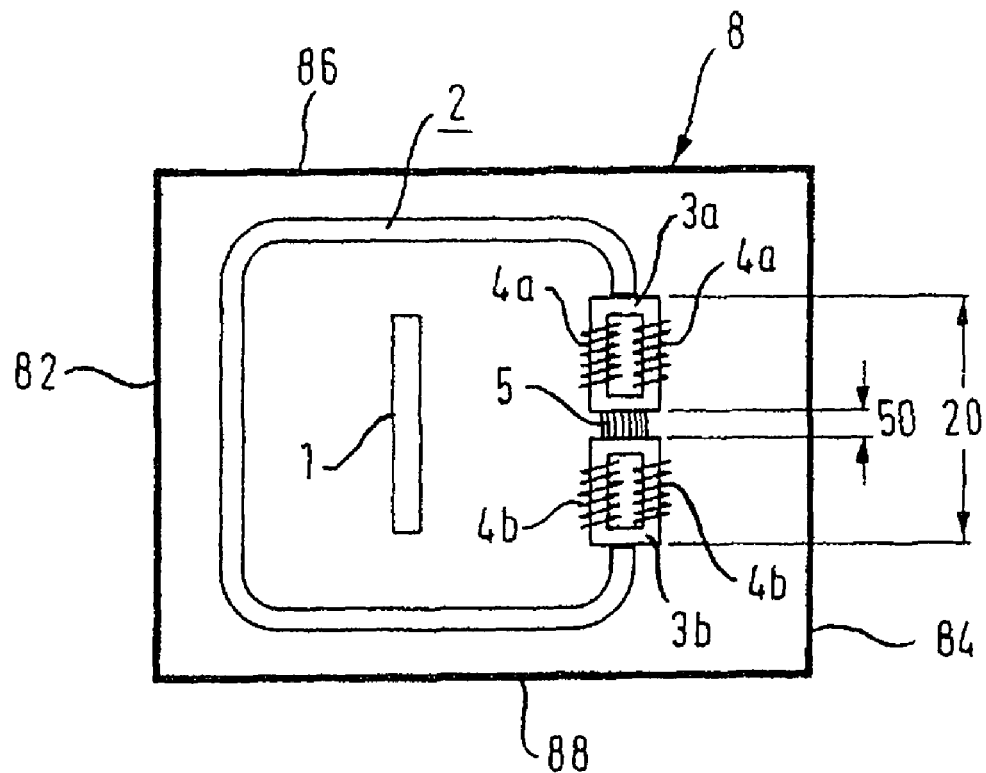
FIG. 1 is a schematic diagram of the device in a first embodiment having a first magnetic shield.

Aspect of the present invention include providing a device and a method for measuring a current flowing in an electrical conductor which addresses the drawbacks of the prior art and enables reliable measurement of a current in an electrical conductor over a broad measuring range.

According to one embodiment, the device has a magnetic circuit for coupling to the electrical conductor. The magnetic circuit includes an air gap, and a magnetic field sensitive component disposed in air gap. The magnetic field sensitive component is capable of measuring the magnetic field generated by the electrical conductor. The device may also include at least one control core that is disposed in the air gap of the magnetic circuit to control the air gap. The control core may have a control winding that, when energized, may cause the control core to become magnetically saturated the in order to control the effective length of the air gap.

Since the current sensor is based on the principle of measuring the magnetic field of a conductor through which a current is flowing, an external magnetic field may influence the measured result. Such magnetic fields which influence the measured result may be generated, for example, by loudspeaker systems operated in a motor vehicle or by current carrying lines, in particular lines in which high currents are flowing. In addition, the terrestrial magnetic field may also have an influence on the measurement.

According to embodiments of the invention, the magnetic circuit, the magnetic field sensitive component and/or the at least one control core are accordingly enclosed, at least in part, by a magnetic shield.

The magnetic shield may protect, at least in part, against magnetic fields that would normally act upon the magnetic circuit, the magnetic field sensitive component and/or the control cores.

The term magnetic shield, as used herein, is understood here to mean an apparatus that protects the current measuring device from external magnetic field, such as by weakening the effect of an external magnetic field on the current measuring device. In particular, a magnetic field acting upon a component is weakened by the magnetic shield such that a component situated behind or within the magnetic shield is exposed to a weaker magnetic field than a component situated outside the magnetic field. In other words, the magnetic field may be stronger outside the magnetic shield than within the magnetic shield. Thus, embodiments of the shield may simply reduce the strength of an external magnetic field, instead of completely eliminating the external magnetic field. Although in some embodiments, the external magnetic field may be completely eliminated, as aspects of the invention are not limited in this respect.

An effective length of the air gap in the device may be variable, due to the disposition of the magnetic field sensitive component in the air gap together with the at least one control core. When the control core is unsaturated, the effective air gap length substantially corresponds to the extension of the magnetic field sensitive component. When, on the other hand, the control core is saturated by applying a current to the control winding, the control core becomes ineffective for the magnetic circuit. The magnetic field sensitive component is then located in an overall air gap that is enlarged by the length of the now saturated and thus ineffective control core.

The device thus has a measuring range switching that is realized by passing a current through the control winding of the control core. By passing a current through the control winding of the control core, and due to the magnetic saturation of the associated control core, which becomes ineffective for the magnetic circuit. As a result, the effective air gap of the magnetic circuit is enlarged and the field bound in the magnetic circuit is weakened. In this way it is possible, using the magnetic field sensitive element, to measure large currents which induce large magnetic fields in the magnetic circuit, as the field bound in the magnetic circuit is weakened by the enlarged air gap at high currents.

To measure smaller currents, the control winding of the control core may be switched off so that the control core fills a larger area of the air gap with magnetizable material. Thus with the control winding switched off, the effective air gap may only comprise the magnetic field sensitive component.

The dynamic response of the magnetic field sensitive component may be utilized particularly well, as a result. It is possible to prevent the magnetic field to be measured from exceeding the existing dynamic response of the magnetic field sensitive component and thus to prevent erroneous measurements from occurring. Therefore, the device provides an effective measuring range switching due to adaptation of the magnetic field to be measured by changing the effective length of the air gap.

According to one embodiment, the magnetic shield is designed in the form of a container that encloses the magnetic circuit, the magnetic field sensitive component and/or the control core. This container may also be a box that encloses essentially all of the components of the remaining device that are influenceable by a magnetic field. As a result, it is possible to achieve reliable shielding of the magnetic field since all of the parts sensitive to an external magnetic field can be disposed inside the container.

The container can be open on at least one side so as to facilitate access to the individual components of the device.

The container and/or the magnetic shield may, however, also be substantially closed except for through holes for electrical and magnetic conductors. The electrical conductors may be, for example, feed lines to the control windings or feed and output lines of the magnetic field sensitive component, particularly of a Hall effects sensor. The electrical conductor through which current is to be measured, may also enter the container through a through-hole. Magnetic conductors may, for example, also be parts of the magnetic circuit that are disposed outside the container, or other magnetic conductors of the device.

The magnetic shield may represents the outermost spatial boundary of the device. In such embodiments, all of the parts of the device that might be influenced by an outer or external magnetic field may be disposed inside the magnetic shield. In such embodiments, supply lines to the windings or the magnetic field sensitive component may be disposed outside the magnetic shield. Furthermore, analyzing and control devices may likewise be situated outside the magnetic shield. These may, however, also be included inside the magnetic shield so as to form a closed system, according to some embodiments.

In one embodiment the magnetic shield is designed so as to enclose all measurement, control and analyzing components. Here, only supply lines for electrical power for driving the individual components, and output lines through which the measured current is signaled are passed outside of the shield. In addition, the electrical conductor to be measured may pass through the shield.

The magnetic shield may include a magnetically conductive material, in particular a metallic material such as, for example, an Mu metal, in order to achieve as effective a shielding of the components reacting to the magnetic field as possible.

The magnetic shield may be disposed so as to provide a substantial shield against an external magnetic field. This may prove advantageous if the components that are influenced by the external magnetic field are not completely enclosed by the magnetic shield. This may be the case, for example, if the components are received in a container that is open on one side. In such embodiments, the magnetic shield may be disposed so as to shield the components that may be influenced by the magnetic field as well as possible against the external magnetic field. For example, the closed sides of the shield may be facing towards an interfering, current-carrying conductor or towards an interfering loud-speaker magnet. In this context, the magnetic shield may also be an individual shielding sheet or another flat shielding element that is arranged in a corresponding position.

A suitable magnetic shield may be achieved by the selection and geometric design of the magnetic shield. In particular the parameters of the material of the actual shield, the material thickness, the geometric configuration of the shield and the distance between the shield and the sensor, have an influence in this regard. Furthermore, the field direction and the field strength of the interfering external magnetic field also play a part and may be considered in the geometric design and the orientation of the shield.

The magnetic shield may comprises at least one through-hole for passing through electrical and/or magnetic conductors, as already described further above.

In one embodiment of the invention, two separate control cores are disposed in the air gap and the magnetic field sensitive component is disposed between the control cores. Due to the construction with two separate control cores and disposition of the magnetic field sensitive component between them, the magnetic field sensitive component, e.g. a Hall sensor, is disposed in the central area of the air gap. If these two cores are specifically saturated by passing a current through the control winding, then the Hall sensor is located in the centre of the effective air gap that arises. The bound magnetic field is lowest at this point as a result of which the highest possible currents can be measured.

Furthermore, by the provision of two separate control cores it is possible to realize a three-stage switching, that is to say a switching between a state in which no single control core is saturated, a state in which a single control core is saturated and a state in which both control cores are saturated.

To operate the sensor with high sensitivity, the control windings are switched off, such that the magnetic field sensitive component measures the magnetic field carried in the overall magnetic circuit. The overall magnetic circuit then consists of the magnetic circuit plus the control cores. With the control windings switched on, the magnetic field sensitive component is located in the position in the now effective air gap at which the magnetic field is weakest, that is in the centre of the air gap. As a result, the maximum achievable measuring range switching is attained. The measuring range is maximized accordingly.

The device may disposed in the vicinity of an earth conductor or a positive conductor of a vehicle battery, such as a motor vehicle battery. The device is may also be disposed in the vicinity of an electrical load or a group of electrical loads of a vehicle. This may make it possible to easily monitor a leak current monitor and a charging or discharging current. This may also make it possible to monitor the current consumption of individual loads or individual load groups in a vehicle. Due to the magnetic shield, the device may also be used in magnetically difficult environments, in particular also in the engine compartment of a motor vehicle or in the vicinity of large electrical consumer loads.

The method for measuring a current flowing in an electrical conductor may be carried out by means of the device described above. According to the invention, in order to measure the current, at least one measurement of the magnetic field may be carried out in the magnetic circuit without excitation of the control core and a further measurement of the magnetic field is carried out in the magnetic circuit with saturated control core.

When two control cores are provided, a further measurement may be carried out in a single saturated control core. In a further embodiment of the method, a measurement may initially be performed with saturation of a first control core and then with saturation of the second control core, by means of which a double or triple measuring range switching becomes possible with the result that currents can be measured reliably in a broad range.

The invention also relates to a use of the device in a motor vehicle for monitoring of currents in the vehicle's on-board electrical system and furthermore to a use of the method described in the motor vehicle for monitoring of currents in the on-board electrical system of a motor vehicle. The device described or the method described may, however, also be used as a current sensor in other areas of applications.

Turn now to the figures and initially FIG. 1, which shows a schematic diagram of a first embodiment of a device for measuring a current flowing in an electrical conductor.

The device may be used to measure a current flowing through an electrical conductor 1. The device comprises a magnetic circuit 2, which has an air gap 20. Two control cores 3a and 3b are disposed in the air gap 20. It is, however, also possible to have a greater number of control cores, or only a single control core disposed in the air gap 20.

The control cores 3a and 3b, as shown, are directly connected to magnetic circuit 2 on respective sides that face towards magnetic circuit 2. In the embodiment shown, control cores 3a, 3b are designed as ferrite cores that form a substantially rectangular frame. Control windings 4a and 4b are attached, respectively, on two long sides of the substantially rectangular ferrite core frame 3a, 3b.

A gap 50 is formed between the two control cores 3a, 3b, in which a magnetic field sensitive component 5 is disposed. In the illustrated embodiment, magnetic field sensitive component 5 is a Hall sensor, although other types of sensors may also be used. The two control cores 3a, 3b and magnetic field sensitive component 5 fill air gap 20 of magnetic circuit 2. In another exemplary embodiment (not shown), the gap 20 of magnetic circuit 2 is not completely filled but rather an actual air gap that lacks a physical element exists between the control cores and the magnetic field sensitive component. It is to be appreciated that the term "air gap", as used herein refers to the space between active portions of the magnetic circuit, and that the effective length of the air gap may be altered during operation, such as by energizing a control winding about a control core of the device.

A magnetic field sensitive component 5 is shown coupled into magnetic circuit 2 to measure the magnetic field surrounding electrical conductor 1, and thus to measure the current flowing through the electrical conductor.

A cross section of a magnetic shield 8 is shown in the illustrated embodiment As may be recognized, shield 8 is substantially similar to a container or box having walls 82, 84, 86, 88. The two walls lying in the plane of FIG. 1 are not shown, but are present. The magnetic shield 8 comprises a metallic material such that the components lying within the magnetic shield 8, in particular magnetic circuit 2, control cores 3a, 3b, as well as magnetic field sensitive component 5, are shielded against an externally acting magnetic field. As a result, the magnetic field acting upon the components is weaker inside the container than it would be without the shield.

Through-holes may be provided, for example, for conductor 1 as well as for supply lines to control windings 4a, 4b and to magnetic field sensitive component 5. These through-holes are not shown in the Figures and are may be designed so as to ensure the greatest possible magnetic shielding. In particular, the through-holes in magnetic shield 8 may be selected so as to tightly enclose the respective conductor in order to prevent the penetration of magnetic field lines.

When currents flowing through electrical conductor 1 are small, no current at all is applied to control windings 4a, 4b in order to set the device's sensitivity to high. The air gap of the effective magnetic circuit is then only in the order of magnitude of the air gap between the two control cores 3a, 3b, which corresponds to the width of component 5.

The magnetic field found in magnetic circuit 2 is sensed by the magnetic field sensitive component.

When large currents are to be measured, a control current may be applied to control coils 4a, 4b to saturate the control cores 3a, 3b. In doing so, the effective length of the air gap of magnetic circuit 2 corresponds to gap 20, as illustrated, since the saturated control cores do not contribute any more to the magnetic circuit. In this situation, magnetic field sensitive component 5 may be positioned in the centre of air gap 20 of magnetic circuit 2, where the magnetic field of magnetic circuit 2 may be weakest. Positioning the magnetic field sensitive component in this manner may facilitate measurement of especially large currents through electrical conductor 1 without exceeding the magnetic field sensitive component's dynamic response.

Figure 2:
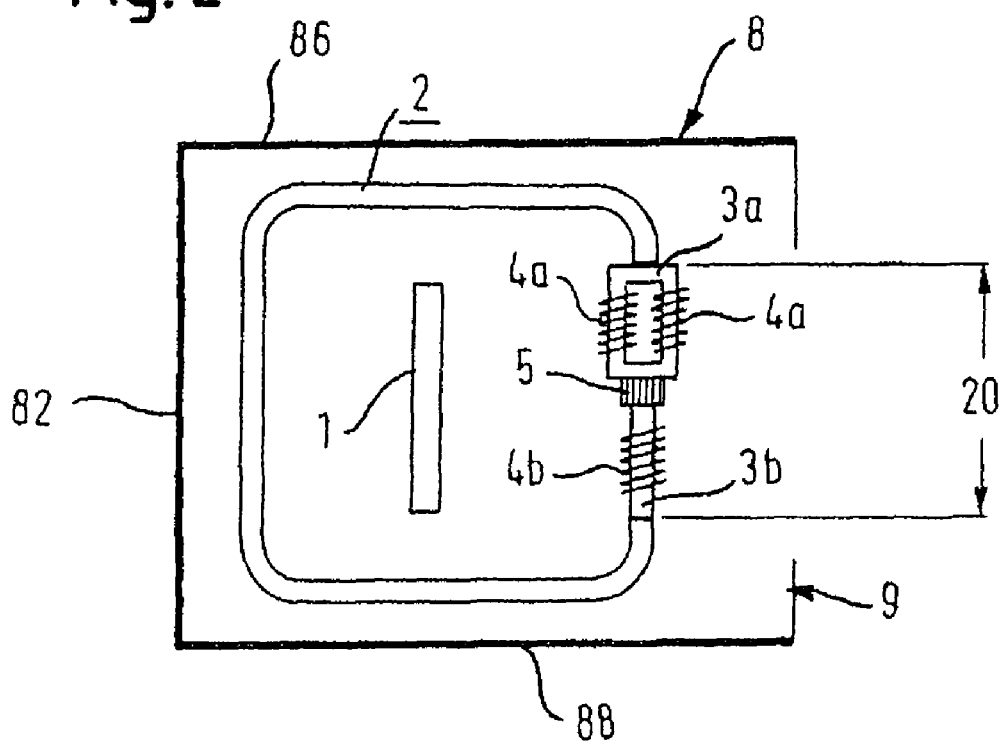
FIG. 2 is a schematic view of the device in a second embodiment having a second magnetic shield.
Figure 3:
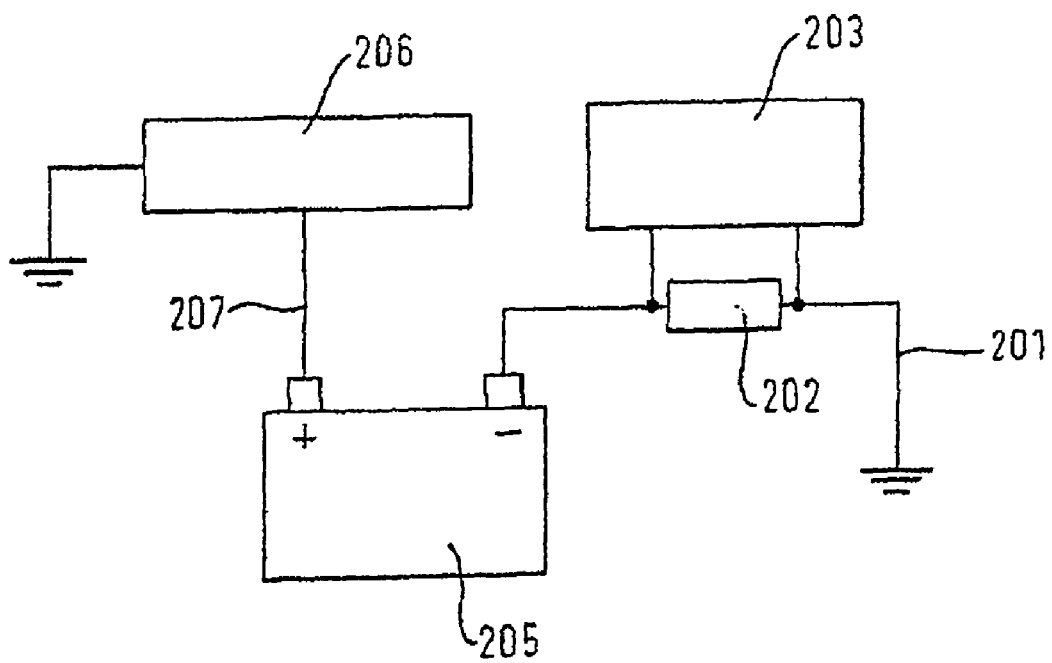
FIG. 3 is a schematic diagram of a sensor for measuring battery current according to the prior art.
Figure 4:
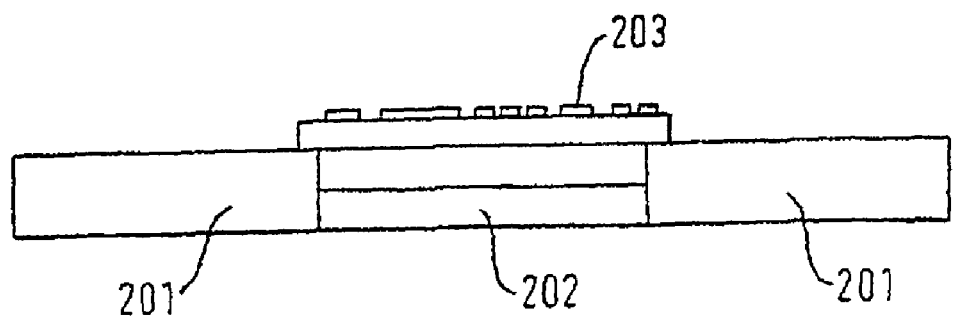
FIG. 4 is a sectional diagram of the measuring shunt and the analyzing unit from FIG. 3 according to the prior art.

FIG. 2 shows a second embodiment of the invention, which differs from that shown in FIG. 1 by the arrangement of the second control core 3b in respect of the first control core 3a. As shown, the plane lying within the frame of control core 3b is turned by 90 degrees vis-à-vis the plane lying within control core 3a. As a result it is possible to minimize the area of the air gap and thus further improve the sensitivity of the device for low currents. In the illustrated embodiment, the area of the air gap corresponds to a square area with a side length corresponding to the width of ferrite core frame 3a and 3b respectively. In such an embodiment, it may be possible to achieve additional increases sensitivity at low currents.

FIG. 2 likewise shows a magnetic shield 8 which also has walls 82, 86, 88. As can be seen from FIG. 2, the wall 84 that is shown in FIG. 1 does not exist, but rather the magnetic shield 8 is open towards the side 9. This may enables simple assembly and, may provide easy access to individual components within the magnetic shield 8. Furthermore, the material costs for the non-existing wall can be saved and the magnetic shield 8 can be implemented as a whole with a lower weight. In addition, ventilation and/or cooling of the components received in the magnetic shield 8 may be improved since the magnetic shield 8 is open.

In the case of FIG. 2, the opening 9 is oriented so as to face away from a possibly interfering external magnetic field. The wall 82 of magnetic shield 8 is thus disposed in particular towards the external magnetic interference field.

The magnetic field sensitive component 5 may be connected to an analyzing device (not shown) that includes a controller (not shown). The controller may be configured to separately excite control windings 4a, 4b, which may facilitate a measuring process that includes measuring the currents in a first measuring range with no excitation applied to control windings 4a, 4b, in a second measuring range where one of control windings 4a or 4b is charged with an excitation current to saturate the respective control core 3a, 3b, and then in a third measuring range for measuring high currents where both control cores 3a, 3b are saturated by applying corresponding control currents to each of control windings 4a, 4b. When both control cores are energized, the magnetic field sensitive component 5 may be positioned in the center of the effective air gap between portions of the magnetic circuit 2.

In other embodiments, more than two control cores may be disposed in the air gap such that, by combining the respective saturation currents or by combining the respective saturations of the control cores, different effective air gap lengths can be generated in respect of magnetic field sensitive component 5. As a result, it may be the measuring range of the device may be adapted to accommodate a wide variety of electric currents.

Embodiments of the device may be especially suitable for monitoring currents in motor vehicles due to the large measuring range switching.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the descriptions and drawings herein are by way of example only.

The invention claimed is:

1. A device for measuring a current flowing in an electrical conductor, said device comprising:
   a magnetic circuit adapted to be coupled to the electrical conductor, the magnetic circuit having an air gap;
   a magnetic field sensitive component disposed in the air gap to measure a magnetic field generated by the electrical conductor;
   at least one control core having a control winding configured to control an effective length of the air gap when the control winding is energized; and
   a magnetic shield that at least partially encloses at least one of the magnetic circuit and the magnetic field sensitive component, and the at least one control core, wherein the at least one control core comprises two control cores disposed in the air gap, and wherein the magnetic field sensitive component is disposed between the two control cores.

2. The device according to claim 1, wherein the magnetic shield comprises a box-like container that at least partially encloses the magnetic circuit, the magnetic field sensitive component and the at least one control core.

3. The device according to claim 2, wherein the container is open on at least a side.

4. The device according to claim 2, wherein the container is substantially closed except for through-holes for electrical and/or magnetic conductors.

5. The device according to claim 1, wherein the magnetic shield comprises an outermost spatial boundary of the device.

6. The device according to claim 1, wherein the magnetic shield includes a metallic material.

7. The device according to claim 1, wherein the magnetic shield is disposed to provide a substantial shield against an external magnetic field.

8. The device according to claim 1, wherein the magnetic shield has at least one through hole to provide access for conductors.

9. The device according to claim 1, wherein the device is disposed in the vicinity of a conductor of a vehicle battery.

10. The device according to claim 1, wherein the device is disposed in the vicinity of an electrical consumer load of a vehicle.

11. The device according to claim 1, wherein the magnetic shield encloses the magnetic circuit, except for at least one conductor through hole.

* * * * *